United States Patent [19]

Fukuhama et al.

[11] Patent Number: 4,980,864
[45] Date of Patent: Dec. 25, 1990

[54] SEMICONDUCTOR DYNAMIC RANDOM ACCESS MEMORY WITH RELAXED PITCH CONDITION FOR SENSE AMPLIFIERS AND METHOD OF OPERATING THE SAME

[75] Inventors: Ryoji Fukuhama; Hideshi Miyatake, both of Hyogo, Japan

[73] Assignee: Mitsubishi Denki Kabushiki Kaisha, Tokyo, Japan

[21] Appl. No.: 282,142

[22] Filed: Dec. 9, 1988

[30] Foreign Application Priority Data

Dec. 15, 1987 [JP] Japan ................. 62-317903

[51] Int. Cl.$^5$ ............................................. G11C 11/34
[52] U.S. Cl. ................... 365/206; 365/208; 365/149
[58] Field of Search ........... 365/149, 205, 207, 189.02, 365/230.02, 190, 203, 51, 208, 206

[56] References Cited

U.S. PATENT DOCUMENTS

| | | | |
|---|---|---|---|
| 4,367,540 | 1/1983 | Shimohigashi | 365/207 |
| 4,581,720 | 4/1986 | Takemae et al. | 365/222 |
| 4,625,298 | 11/1986 | Sumi | 365/190 |
| 4,872,142 | 10/1989 | Hannai | 365/189.07 |

FOREIGN PATENT DOCUMENTS

56763  5/1978  Japan.
167522  9/1982  Japan.

Primary Examiner—Joseph A. Popek
Attorney, Agent, or Firm—Lower, Price, LeBlanc, Becker & Shur

[57] ABSTRACT

A semiconductor dynamic random access memory is provided comprising bit line pairs divided into groups and sense amplifiers, one for each bit line pair group provided on one side of the bit line pairs in a line. When a word line is selected, only one bit line pair is released from a precharge.equalize state to be connected to a corresponding sense amplifier in each bit line pair group in accordance with address information of the word line. Memory cells are arranged such that only one memory cell is connected to the selected word line in each bit line pair group.

12 Claims, 6 Drawing Sheets

SEMICONDUCTOR DYNAMIC RANDOM ACCESS MEMORY WITH RELAXED PITCH CONDITION FOR SENSE AMPLIFIERS AND METHOD OF OPERATING THE SAME

BACKGROUND OF THE INVENTION

1. Field of the Invention

The present invention generally relates to a semiconductor dynamic RAM (Random Access Memory) and, more specifically, to an arrangement of memory cells and sense amplifiers in a dynamic RAM for relaxing pitch condition imposed on the sense amplifiers and a method of operating the same.

2. Description of the Background Art

Figure 5:
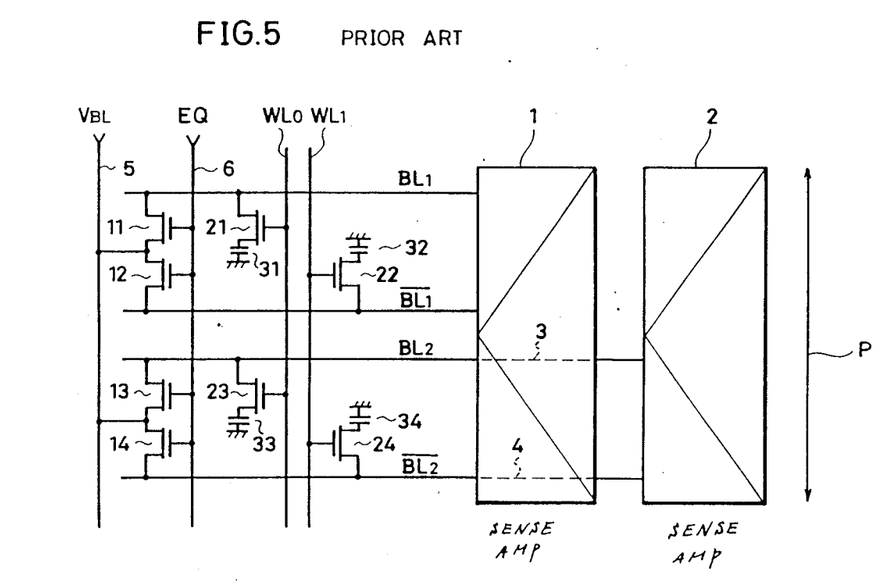
FIG. 5 is a schematic diagram showing a structure of a memory cell array portion of a conventional semiconductor dynamic RAM.

FIG. 5 schematically shows a conventional memory cell array structure of a semiconductor dynamic RAM. In FIG. 5, two bit line pairs BL1, $\overline{BL1}$ and BL2, $\overline{BL2}$ are shown as representatives for the purpose of simplicity.

Equalizing transistors 11 and 12 are provided on the bit line pair BL1, $\overline{BL1}$ for equalizing potentials of the bit lines BL1 and $\overline{BL1}$ to $V_{cc}/2$ (where $V_{cc}$ is an operational supply potential). Both equalizing transistors 11 and 12 turn on in response to an equalizing signal EQ applied through a signal line 6 and transmit a potential $V_{BL}$ applied through a signal line 5 to the bit lines BL1 and $\overline{BL1}$.

Similarly, equalizing transistors 13 and 14 are provided on the bit line pair BL2, $\overline{BL2}$ which turn on in response to the equalizing signal EQ for equalizing the potentials on the bit lines BL2 and $\overline{BL2}$ and for transmitting the constant potential $V_{BL}$ to each of the bit lines BL2 and $\overline{BL2}$.

A sense amplifier 1 for differentially amplifying signal potentials on the bit line pair BL1, $\overline{BL1}$ are provided on the bit line pair BL1, $\overline{BL1}$, while a sense amplifier 2 for differentially amplifying signal potentials on the bit line pair BL2, $\overline{BL2}$ is provided on the bit line pair BL2, $\overline{BL2}$. A pitch P of the sense amplifiers 1 and 2 is selected to be in correspondence with that for the two bit line pairs. Consequently, the sense amplifiers 1 and 2 are a:.ranged in parallel to each other along a direction of extension of the bit lines, the bit lines BL2 and $\overline{BL2}$ being connected to the sense amplifier 2 by means of multilayer interconnections 3 and 4 passing over the sense amplifier 1, respectively. Each of the bit line pairs BL1, $\overline{BL1}$ and BL2, $\overline{BL2}$ constitute so called folded bit lines, and therefore memory cells are disposed at intersections of ore bit line and every other word line in each bit line pair. More specifically, a memory cell comprising a transistor 21 and a capacitor 31 for storing information in the form of charges is disposed at an intersection of the word line WL0 and the bit line BL1. A memory cell comprising a transfer gate transistor 23 and a capacitor 33 is disposed at an intersection of the bit line BL2 and the word line WL0. A memory cell comprising a transfer gate transistor 22 and a capacitor 32 and a memory cell comprising a transfer gate transistor 24 and a capacitor 34 are respectively provided to the intersections of the word line WL1 and the bit lines $\overline{BL1}$ and $\overline{BL2}$.

Figure 6:
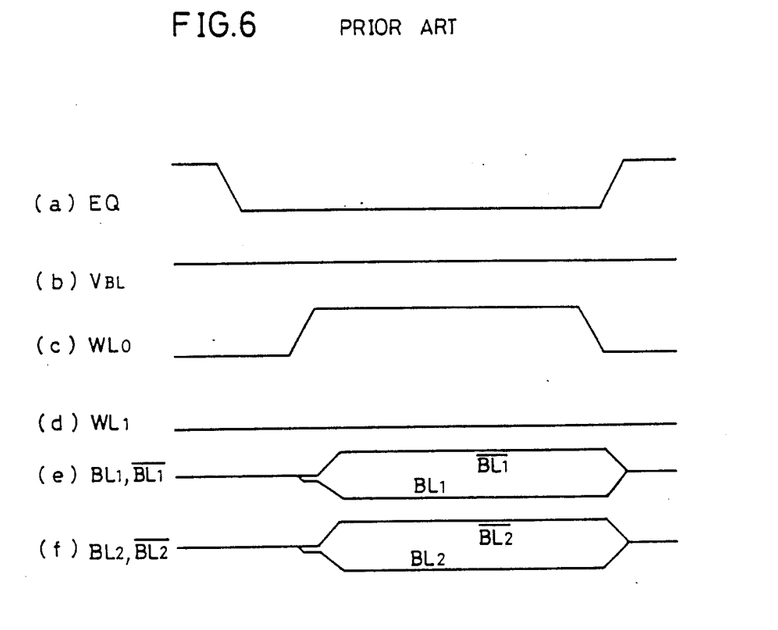
FIG. 6 is a diagram of waveforms of signals showing the operation of the conventional semiconductor dynamic RAM shown in FIG. 5.

FIG. 6 is a diagram of waveforms illustrating the operation of the dynamic RAM shown in FIG. 5, in which waveforms of signals when the word line WL0 is selected are shown. The operation of the conventional dynamic RAM will be described in the following with reference to FIGS. 5 and 6.

While an equalizing signal EQ applied to the signal line 6 is at a high level, all equalizing transistors 11 to 14 are in the on state. Therefore, the bit line potentials, that is, the ground potential GND and the supply potential $V_{cc}$ which appeared on each of the bit line pairs in the last memory cycle are equalized and a constant potential $V_{BL}$ applied through the signal line 5 is transmitted to each of the bit lines BL1, $\overline{BL1}$, BL2 and $\overline{BL2}$ through respective equalizing transistors 11 to 14, whereby the potential of each bit line is held at $V_{cc}/2$.

After the equalizing signal EQ falls to a low level, the word line WL0 is selected by decoder means, not shown, so that the potential on the word line WL0 becomes a high level. Consequently, the transfer gate transistors 21 and 23 connected to the word line WL0 are turned on, and the information held in the memory capacitor 31 is read to the bit line BL1 while the information stored in the memory capacitor 33 is read to the bit line BL2. FIG. 6 shows a case in which the information "0" is read to the bit lines BL1 and BL2, as an example. Thereafter, the sense amplifiers 1 and 2 are brought to an active state, and the bit lines BL1 and BL2 of a lower potential are discharged to the ground potential GND, while the bit lines $\overline{BL1}$ and $\overline{BL2}$ of the higher level potential are charged to the supply potential $V_{cc}$. In other words, the read-out signal potentials in each bit line pair are amplified. Thereafter, a pair of bit lines is selected in response to an output from a column decoder, not shown, and the signal potentials on the selected bit line pair are transmitted to data input/output lines to be externally outputted. By the time when the signal potential on the selected word line WL0 becomes low level, the information of the ground potential of GND level, that is, a low level, has been written again in the memory capacitors 31 and 33 connected to the selected word line WL0. Thereafter, the equalizing signal EQ becomes a high level, and the ground potential GND and the supply potential $V_{cc}$ which are the potentials on each of the bit line pairs are equalized by the equalizing transistors 11 to 14 to be $V_{cc}/2$.

The data reading and the refreshing operation in the dynamic RAM are carried out by repeating the above described operation for a required number of times.

As the capacity of a dynamic RAM has been increased, each memory has been made minute. Accordingly, various device components formed in the semiconductor processes have been increasingly miniaturized. In the miniaturization, the pitch between the bit lines and the pitch between the bit line pairs can be made smaller simply in accordance with the reduction of the memory size. However, as for the sense amplifiers, the sense amp pitch P can not be made smaller in accordance with the miniaturization of the pitch between bit lines, since a large number of transistors are included in the sense amplifier and the structure thereof is complicated. Therefore, a structure such as shown in FIG. 5 has been inevitably employed in which two rows of sense amplifiers are arranged in parallel to each other and the sense amplifier 2 is arranged outside of the sense amplifier 1 by utilizing multilayer interconnections to relax the sense amp pitch P. In that case, however, sense amplifiers are arranged on two lines in parallel to each other so that the chip area is increased along with the increase of the area required for laying out the sense amplifiers, causing the increase of the cost of the dynamic RAM.

Figure 7:
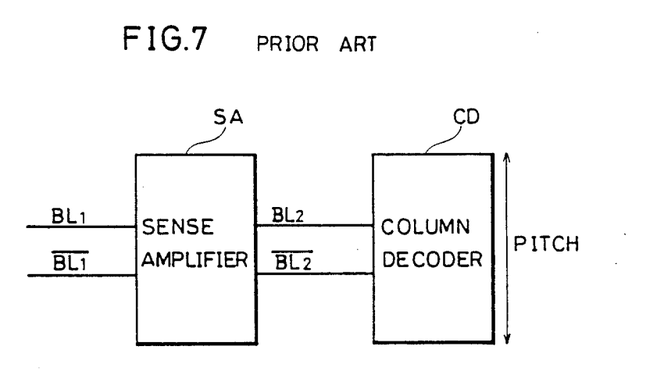
FIG. 7 is a schematic diagram showing a structure of a conventional shared sense amplifier structure.

A structure such as shown in FIG. 7 has been known as one structure of the memory cell array of a conventional dynamic RAM, in which the bit line pairs are divided, a sense amplifier SA is provided at the central portion of the bit lines, only the divided bit line pair BL1, $\overline{BL1}$ (or BL2, $\overline{BL2}$) is connected to the sense amplifier SA to amplify the read-out potential thereon, and the read-out signal potentials are transferred to the data input/output bus in response to an output of a column decoder CD (disclosed in, for example, Japanese Patent Publication Gazette No. 46918/1986). However, in the so called shared sense amplifier structure shown in FIG. 7, the reading and the writing of data are carried out through a data input/output buffer from the side of the column decoder. Therefore, after the sensing operation, the read-out (amplified) signal potentials have to be transmitted on the data input/output bus through the divided bit lines BL2 and $\overline{BL2}$. This means that the precharge potentials on the divided bit line pairs BL2 and $\overline{BL2}$ are discharged, causing unnecessary power consumption. In addition, when the pitch between bit lines is made smaller, the pitch of the column decoder (unit column: decoder) as well as the pitch of the sense amplifier SA can not cope with the reduction of the pitch between bit lines in the shared sense amplifier structure, and therefore, the pitch condition of the column decoder also becomes severe.

Another structure is proposed in Japanese Patent Laying Open Gazette No. 58689/1984 in which sense amplifiers are provided on both sides of a plurality of bit line pairs, the sensing operation is carried out on the selected bit line pair by the sense amplifier on one side and the refreshing operation is carried on the non-selected bit line pair by the sense amplifier on the other side, so as to relax the pitch condition of the sense amplifiers. In this structure, however, the sense amplifiers are provided on both sides of the bit line pairs, thereby increasing the area required for the sense amplifiers as well as the area of the chip. In addition, in any of the above described structures of the prior art, one memory cell is selected in each bit line pair when one word line is selected, so that if the pitch between bit lines is made smaller, the influence of noise from adjacent bit line pairs in data reading becomes larger, making it difficult to accurately amplify the read-out signal potentials by the sense amplifiers.

SUMMARY OF THE INVENTION

An object of the present invention is to provide a dynamic RAM which is inexpensive and of low power consumption, capable of eliminating the problems of the above described conventional dynamic RAMs, associated with the minimization of the pitch between bit line pairs while preventing increase of the area for laying out sense amplifiers, and capable of accurately reading signal potentials.

The semiconductor dynamic RAM in accordance with the present invention comprises: sense amplifiers, one for every prescribed number of bit line pairs, provided only on a region of one side of a plurality of bit line pairs extending in one direction in parallel to each other with two adjacent bit lines forming a pair; and means for selectively connecting one bit line pair out of the prescribed number of bit line pairs to a corresponding sense amplifier in accordance with a selected word line, and for holding the remaining bit line pairs at a precharge potential. Preferably, it further comprises memory cells arranged such that only one memory cell is connected to a corresponding bit line by a selected word line in the prescribed number of bit line pairs, when one word line is selected.

In the semiconductor dynamic RAM in accordance with the present invention, one sense amplifier is provided for a prescribed number of bit line pairs, so that the pitch of the sense amplifier can be relaxed to a pitch of the prescribed number of bit line pairs; sense amplifiers are arranged lining up only on one side of the bit line pairs, so that the area occupied by the sense amplifiers can be reduced compared with the case in which sense amplifiers are arranged in two lines in parallel; only one memory cell is selected in the prescribed number of bit line pairs when one word line is selected, so that no memory cell is selected in the non-selected bit line pairs (bit line pairs connected to those memory cells which are in turn connected to the non-selected word lines) and the non-selected bit line pairs are held at the precharge potential, whereby the selected bit line pair is not influenced by the noise from the non-selected adjacent bit line pairs.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
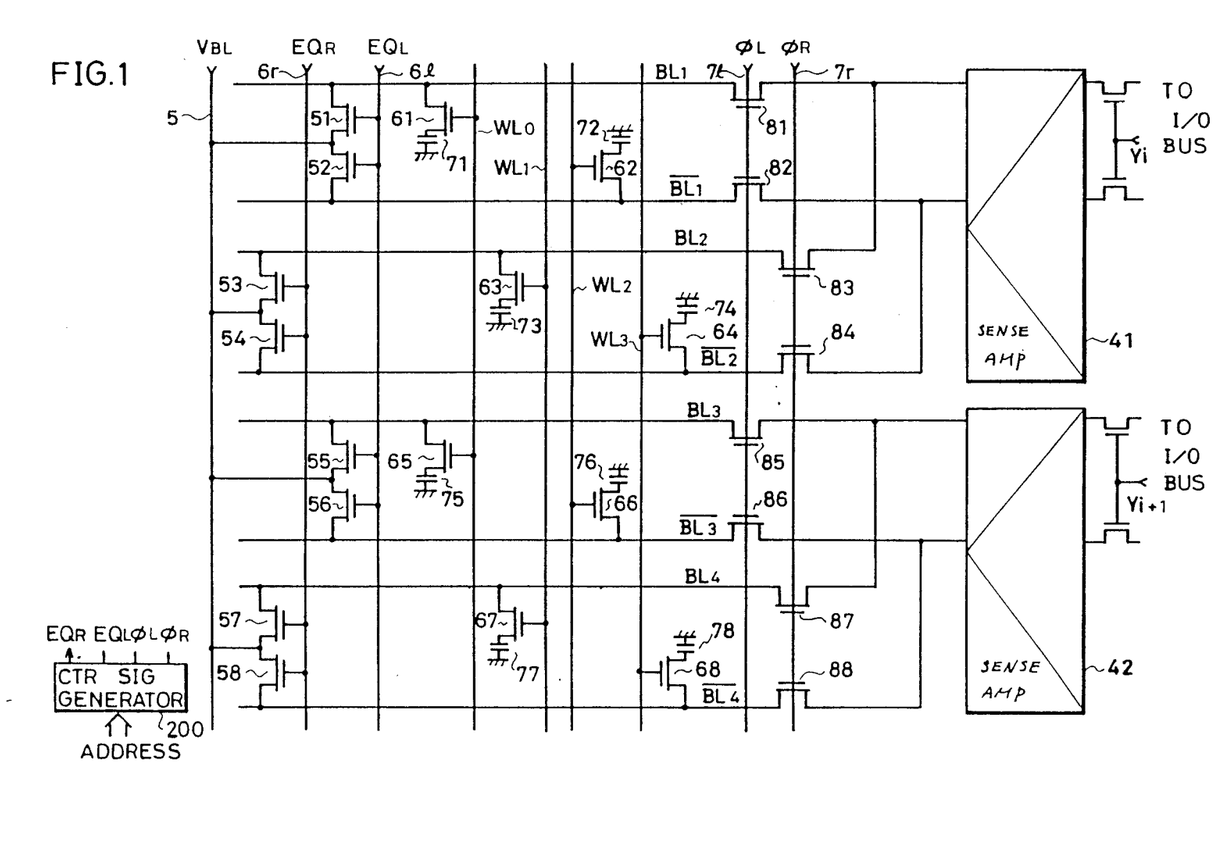
FIG. 1 is a schematic diagram showing a structure of a memory cell array portion of a semiconductor dynamic RAM in accordance with one embodiment of the present invention.

FIG. 1 shows a structure of a memory cell array of a semiconductor dynamic RAM, which is one embodiment of the present invention. For the purpose of simplicity, four bit line pairs BL1, $\overline{BL1}$, BL2, $\overline{BL2}$, BL3, $\overline{BL3}$ and $\overline{BL4}$, and four word lines WL0, WL1, WL2 and WL3 are shown as representatives in FIG. 1.

One sense amplifier 41 is provided in correspondence with two bit line pairs BL1, $\overline{BL1}$ and BL2, $\overline{BL2}$, and one sense amplifier 42 is provided in correspondence with the remaining two bit line pairs BL3, $\overline{BL3}$ and BL4, $\overline{BL4}$, on one side of the bit lines. Equalizing transistors 51 to 58 for equalizing the bit line potentials are provided on the other side of each of the bit line pairs. More specifically, equalizing transistors 51 and 52 are provided for the bit line pair BL1, $\overline{BL1}$, which turn on in response to an equalizing signal $EQ_L$ transmitted through a signal line 61 for equalizing the potentials on the bit lines BL1 and $\overline{BL1}$ as well as for transmitting a constant potential $V_{BL}$ transmitted through a signal line 5 to maintain each of the bit lines BL1 and $\overline{BL1}$ at a constant potential $V_{cc}/2$ during the equalizing period. Equalizing transistors 53 and 54 are provided for the bit line pair BL2, $\overline{BL2}$, which turn on in response to an equalizing signal $EQ_R$ transmitted through a signal line 6r for equalizing the potentials on the bit lines BL2 and $\overline{BL2}$ as well as for transmitting the constant potential $V_{BL}$ transmitted through the signal line 5 to maintain each of the bit lines BL2 and $\overline{BL2}$ at a constant potential $V_{cc}/2$. Equalizing transistors 55 and 56 are provided for the bit line pairs BL3, $\overline{BL3}$ which turn on in response to the equalizing signal $EQ_L$ transmitted through the signal line 6l for equalizing the potentials of the bit lines BL3 and $\overline{BL3}$ as well as for transmitting the constant potential $V_{BL}$ transmitted through the signal line 5 to maintain each of the bit lines BL3 and $\overline{BL3}$ at the constant potential $V_{cc}/2$. Equalizing transistors 57 and 58 are provided for the bit line pair BL4, $\overline{BL4}$, which turn on in response to the equalizing signal $EQ_R$ transmitted through the signal line 6r for equalizing the potentials of the bit lines BL4 and $\overline{BL4}$ as well as for transmitting the constant potential $V_{BL}$ transmitted through the signal line 5 to maintain the potential of each of the bit lines BL4 and $\overline{BL4}$ at the constant potential $V_{cc}/2$.

A transfer gate transistor for selectively connecting only one pair of bit lines to the corresponding sense amplifier is provided between each bit line and the sense amplifier. More specifically, transfer gate transistors 81 ad 82 are provided corresponding to the bit lines BL1 and $\overline{BL1}$, respectively, which turn on in response to a control signal $\phi_1$ transmitted through a signal line 7l for connecting the bit lines BL1 and $\overline{BL1}$ to the sense amplifier 41. Transfer gate transistors 83 and 84 are provided for the bit lines BL2 and $\overline{BL2}$, which turn on in response to a control signal $\phi_R$ transmitted through a signal line 7r for connecting the bit lines BL2 and $\overline{BL2}$ to the sense amplifier 41. Transfer gate transistors 85 and 86 are provided corresponding to the bit lines BL3 and $\overline{BL3}$, which turn on in response to the control signal $\phi_L$ transmitted through the signal line 7l for connecting the bit lines BL3 and $\overline{BL3}$ to the sense amplifier 42. Transfer gate transistors 87 and 88 are provided corresponding to the bit lines BL4 and $\overline{BL4}$, which turn on in response to the control signal $\phi_R$ transmitted through the signal line 7r for connecting the bit lines BL4 and $\overline{BL4}$ to the sense amplifier 42.

Memory cells for storing information are arranged such that only one memory cell is selected in a plurality of bit line pairs (two bit line pairs in the present embodiment) which are connected to one sense amplifier. More specifically, a memory cell comprising a transfer gate transistor 61 and a memory capacitor 71 is provided at an intersection of the word line WL0 and the bit line BL1, and a memory cell comprising a transfer gate transistor 65 and a memory capacitor 75 is provided at an intersection of the word line WL0 and the bit line BL3. A memory cell comprising a transfer gate transistor 63 and a memory capacitor 73 is provided at an intersection of the word line WL1 and the bit line BL2, and a memory cell comprising a transfer gate transistor 67 and a memory capacitor 77 is provided at the intersection for the word line WL1 and the bit line BL4. In the similar manner, a memory cell comprising a transfer gate 62 and a memory capacitor 72 and a memory cell comprising a transfer gate transistor 66 and a memory capacitor 76 are respectively provided at intersections of the word line WL2 and the bit lines $\overline{BL1}$ and $\overline{BL3}$. A memory cell comprising a transfer gate transistor 64 and a memory capacitor 74 and a memory cell comprising a transfer gate transistor 68 and a memory capacitor 78 are respectively provided at intersections of the word line WL3 and the bit lines $\overline{BL}$ and $\overline{BL4}$. In this structure, only one memory cell is selected in the two pairs of bit lines connected to one sense amplifier, when one word line is selected.

In the above described structure, selective transitions to an active state of the equalizing signals $EQ_R$ and $EQ_L$ and of the control signals $\phi_L$ and $\phi_R$ are carried out in accordance with the selected word line under the control of a control signal generator 200. Namely, when even numbered word lines (WL0, WL2) are selected, the selected bit line pairs are the bit line pairs BL1, $\overline{BL1}$, and BL3, $\overline{BL3}$, and therefore the equalizing signal $EQ_L$ is brought into an inactive state, while the control signal $\phi_L$ is brought to an active state. Consequently, the sensing operation or the refreshing operation of the memory cell information is carried out only in the selected bit line pairs. The non-selected bit line pairs are under the precharging (equalizing) operation, and the bit line potentials thereof are maintained at the constant potential of $V_{cc}/2$. The selective transitions between the inactive state and the active state of the equalizing signals $EQ_R$ and $EQ_L$ and of the control signals $\phi_L$ and $\phi_R$ can be easily carried out by sub decoding 1 bit, for example, of the address signals of the selected word line.

Figure 2:
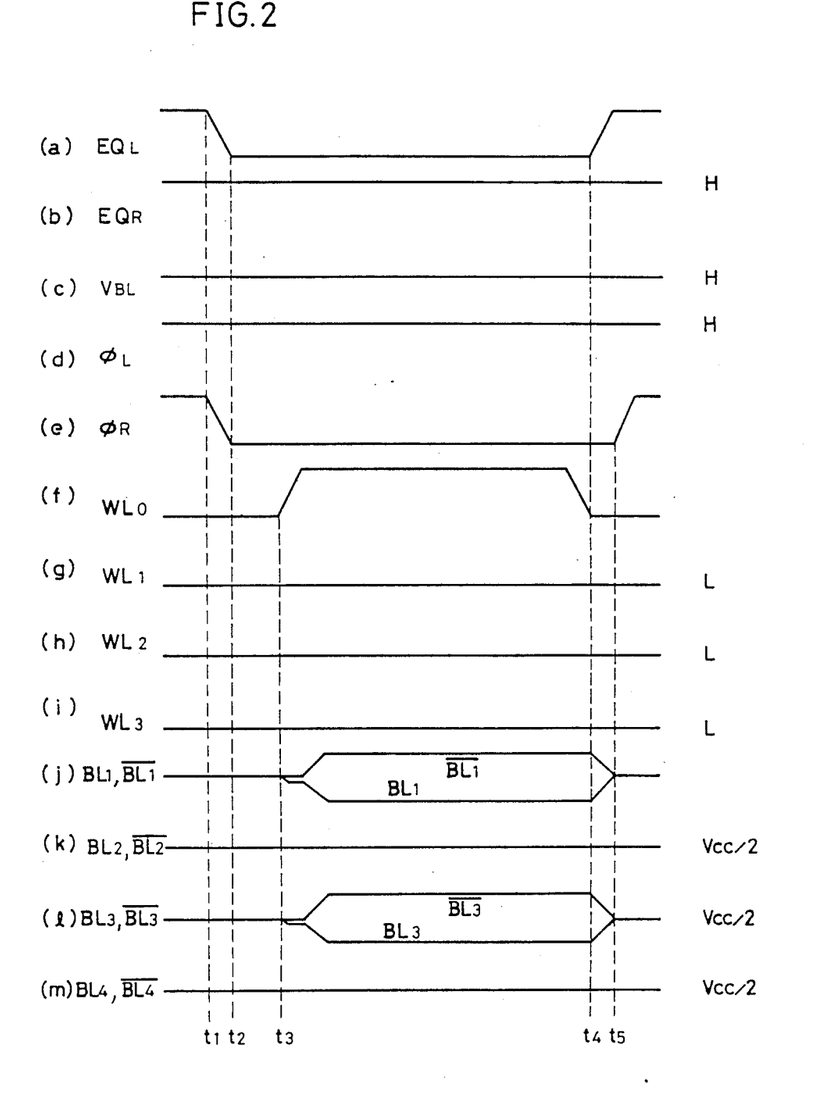
FIG. 2 is a diagram of waveforms of signals showing the operation of the semiconductor dynamic RAM shown in FIG. 1.

FIG. 2 is a diagram of signal waveforms showing the operation of the dynamic RAM having the memory cell array structure shown in FIG. 1. FIG. 2 shows a state in which the word line WL0 is selected and the information "0" is read to the bit lines BL1 and BL3, as an example. The operation of the dynamic RAM, which is one embodiment of the present invention, will be described with reference to FIGS. 1 and 2.

During the equalizing period, the equalizing signals $EQ_L$ and $EQ_R$ are both at a high level, and therefore all the equalizing transistors 51 to 58 are on and the potential on each bit line is held at $V_{cc}/2$ as in the prior art. Then, when the word line WL0 is to be selected, the equalizing signal $EQ_L$ is at first selectively brought to a low level, and the control signal $\phi_R$ is selectively brought to the low level. On this occasion, the signals $\phi_L$ and $EQ_R$ are at the high level as they were in the equalizing period. The selective transition of the equalizing signal $EQ_L$ and of the control signal $\phi_R$ to the low level is carried out based on the address signals of the selected word line WL0. Consequently, the equalizing transistors 53, 54, 57 and 58 are on and the transfer gate transistors 83, 84, 87 and 88 are kept off, and therefore the bit line pairs BL2 and $\overline{BL2}$ and BL4, $\overline{BL4}$ are held at $V_{cc}/2$ during the memory cycle. Now, when the word line WL0 is selected and the potential of the word line WL0 becomes high level, the transfer gate transistors 61 and 65 of the memory cells turn on, and the charges representing information stored in the memory capacitors 71 and 75 are respectively read-out to the bit lines BL1 and BL3. Now, the control signal $\phi_L$ remains at the high level, and therefore the transfer gate transistors 81, 82 and 85, 86 are on and the bit line pairs BL1, $\overline{BL1}$ and BL3, $\overline{BL3}$ are respectively connected to the sense amplifiers 41 and 42. When the potential on the word line WL0 becomes high level and the information held in the memory cells connected thereto is once transmitted to the bit lines BL1 and BL3, respectively, then the sense amplifiers 41 and 42 are activated by driving means, not shown, to amplify the signal potentials on the bit line pairs BL1, $\overline{BL1}$ and BL3, $\overline{BL3}$ to the supply potential $V_{cc}$ and to the ground potential GND, respectively. Thereafter, only one pair of bit lines is selected by an output $Y_i$ of the column decoder, not shown, and the amplified signal potentials are read-out to the outside of the device through a data input/output bus, not shown, in the same manner as in the prior art. Thereafter, when the signal on the word line WL0 becomes low level, the equalizing signal $EQ_L$ accordingly becomes high level, the equalizing transistors 51, 52 and 55, 56 are all turned on to equalize the voltage of the supply potential $V_{cc}$ and the ground potential GND on each of the bit line pairs, whereby the potentials on each bit line becomes $V_{cc}/2$. Thereafter, the control signal $\phi_R$ becomes high level to be ready for the next memory cycle.

In the above described structure, only one sense amplifier has to be provided for two bit line pairs, and there is no need to provide two rows of sense amplifiers in parallel to each other, so that the pitch of the sense amplifier can be relaxed without increasing the lay out area of the sense amplifier, thereby enabling an arrangement of sense amplifiers corresponding to minimization of the pitch between bit lines as well as to the enlargement of capacity of the dynamic RAM.

Since the non-selected bit line pairs are maintained at the precharge potential, the read-out potential of the selected bit line pair is not influenced by the noise derived from the read-out potentials of the adjacent bit line pairs, thereby enabling accurate sensing operation.

Figure 3:
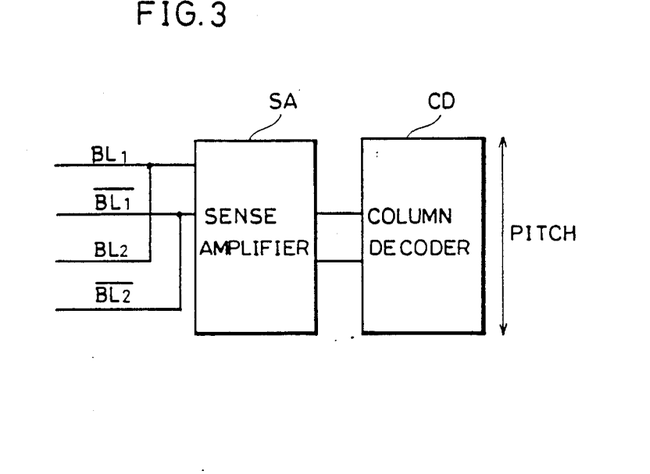
FIG. 3 is a schematic diagram showing the general concept of the semiconductor dynamic RAM of the present invention, illustrating the effect of the semiconductor dynamic RAM of the present invention.

FIG. 3 is a diagram for more definitely illustrating the effect of the dynamic RAM in accordance with the present invention, in which shown are two bit line pairs BL1, $\overline{BL1}$ and BL2, $\overline{BL2}$, a sense amplifier SA provided in correspondence with the two bit line pairs, and a column decoder CD for selecting a pair of bit lines to connect the same to a data input/output bus. As is apparent from a comparison of the array structure shown in FIG. 3 with the conventional shared sense amplifier structure shown in FIG. 7, in the present invention, when a memory cell included in the bit line pair BL1, $\overline{BL1}$ is selected, the sense amplifier SA performs the sensing operation, being connected to the bit line pair BL1, $\overline{BL1}$. Also in the data reading or writing, the operation is not through the bit line pair BL2, $\overline{BL2}$, so that there is no need to charge/discharge the non-selected bit line pair BL2, $\overline{BL2}$. Therefore, there will be no unnecessary power consumption, the pitch of the column decoder CD as well as the pitch of the sense amplifier can be relaxed to a pitch corresponding to the two bit line pairs, thereby enabling a structure following the minimization of the pitch between bit lines.

In addition, in the dynamic RAM in accordance with the present invention, the word line connected to the memory cells of the selected bit line pair BL1, $\overline{BL1}$, is not connected to the memory cells of the non-selected bit line pair BL2, $\overline{BL2}$, while the word line connected to the memory cells of the bit line pair BL2, $\overline{BL2}$ is not connected to the memory cells of the bit line pair BL1, $\overline{BL1}$.

Figure 4:
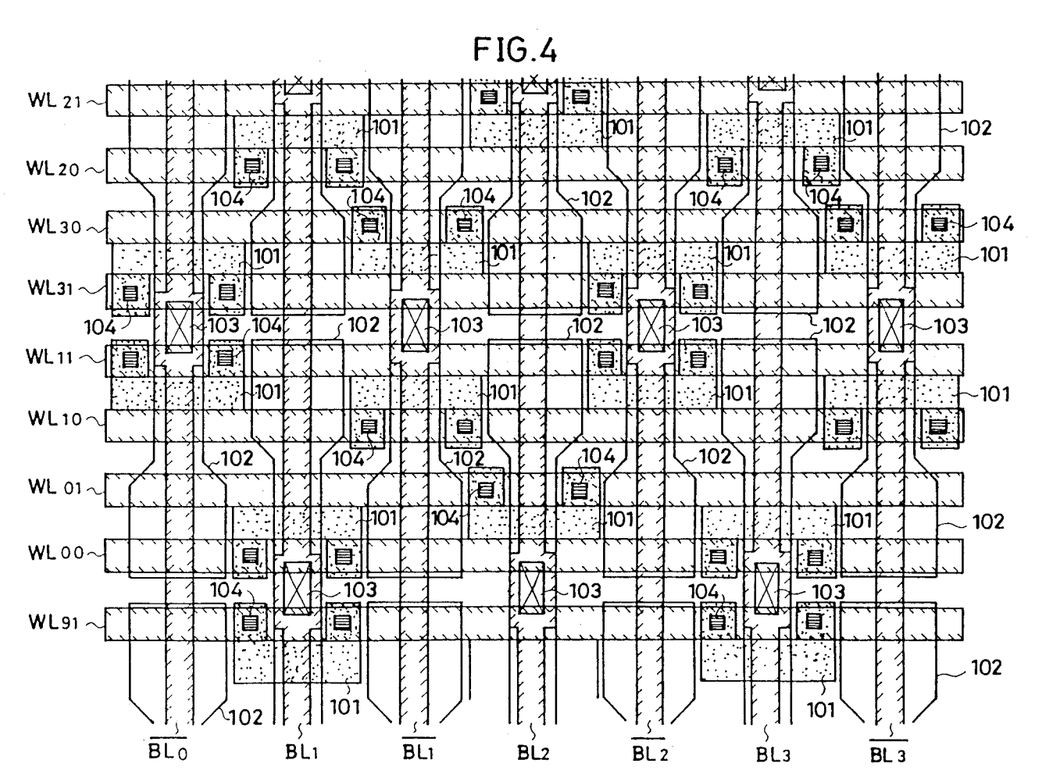
FIG. 4 shows the arrangement of memory cells of the semiconductor dynamic RAM in accordance with one embodiment of the present invention.

FIG. 4 shows an example of a lay out of the memory cell array portion of the dynamic RAM in accordance with one embodiment of the present invention. In the structure shown in FIG. 4, the word lines WL21, WL20, WL30, WL31, WL11, WL10, WL01, WL00 and WL91 are formed of aluminum interconnections. Bit lines $\overline{BL0}$, BL1, $\overline{BL1}$, BL2, $\overline{BL2}$, BL3, and $\overline{BL3}$ are respectively formed of third polysilicon (third level polysilicon) The bit lines BL1 and $\overline{BL1}$ constitute a pair, the bit lines BL2 and $\overline{BL2}$ constitute a pair and the bit lines BL3 and $\overline{BL3}$ constitute a pair. Transfer gates for connecting the memory capacitors of the memory cells are formed of second polysilicon (second level polysilicon) 101. The transfer gates formed of the second polysilicon 101 are connected to respective corresponding word lines through contact holes 104. The capacitor portions of the memory cells are formed of impurity doped layers (for example n+ type impurity doped layers) 102 formed on a semiconductor substrate. The doped layer 102 forms a storage node, which is one electrode of the memory cell capacitor. First level polysilicon provided thereon, namely, the polysilicon constituting a cell plate as the other electrode of the memory cell capacitor is omitted to simplify the drawing. Impurity doped layers (for example n+ impurity doped layers) which are to be electrodes of the transfer gate transistors are connected to the bit lines formed of the third polysilicon layer through contact holes 103. As is apparent from FIG. 4, one memory cell is efficiently arranged at an intersection of every four bit lines (two bit line pairs) and one word line. Namely, when the word line WL00 is selected, the memory cells connected to the bit lines BL1 and BL3 are selected, and there is no memory cell connected to the word line WL00 provided on the bit line pair BL2, $\overline{BL2}$ which is connected to the sense amplifier to which the bit line pair BL1, $\overline{BL1}$ is connected. In other words, for one word line, one memory cell is provided on every fourth bit line. In addition, when the word line WL01 is selected, for example, the memory cell provided at the intersection of the bit line BL2 is selected, so that the bit line pair BL2, $\overline{BL2}$ are connected to the corresponding sense amplifier. The above described lay out enables effective arrangement of the memory cells as well as accurate reading-out of information free from the influence of the noise from the adjacent non-selected bit line pairs.

Although description was given of a structure in which one sense amplifier is provided for two bit line pairs in the foregoing, a structure in which one sense amplifier is provided for every three or more bit line pairs may be employed to obtain the same effect as in the above embodiment.

As described above, according to the present invention, sense amplifiers, one for a prescribed number of bit line pairs, are provided on a region only on one side of the bit lines, only one pair of bit lines of the prescribed number of bit line pairs is connected to the corresponding sense amplifier in accordance with the selected word line, and the memory cells are arranged such that only one memory cell is connected to one word line in the prescribed number of bit line pairs, so that the pitch of the sense amplifier and of the column decoder can be relaxed to be in correspondence with that of the prescribed number of bit line pairs, and unnecessary power consumption can be eliminated as there is no need to charge/discharge the non-selected bit line pairs. In addition, since the non-selected bit line pairs are held at the precharge (equalizing) potential, there is no influence of the noise from the adjacent non-selected bit line pair, that is, the noise derived from the reading-out potential, whereby the information stored in the selected memory cell can be accurately sensed. Since one line of sense amplifiers is arranged only on one side of the bit lines, the area occupied by the sense amplifiers need not be increased, and therefore the chip area is not increased, whereby a semiconductor dynamic RAM can be provided which is inexpensive and of low power consumption capable of accurately detecting memory cell information.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor dynamic RAM having the operation of detecting and amplifying information of a selected memory cell connected to a selected word line by means of a sense amplifier, comprising:
    a plurality of bit line pairs arranged extending in one direction in parallel with each other, with two adjacent bit lines constituting a pair;
    sense amplifier means, one for every prescribed number of bit line pairs out of said plurality of bit line pairs, provided only on one side of said plurality of bit line pairs, said sense amplifier means arranged in a line;
    a plurality of word lines arranged in a direction intersecting said plurality of bit line pairs; and
    selective connecting means for selectively connecting only one pair of bit lines out of said prescribed number of bit line pairs to a corresponding sense amplifier means in accordance with an address of a selected word line among said plurality of word lines and for holding remaining bit line pairs at a precharge potential.

2. A semiconductor dynamic RAM according to claim 1, further comprising a plurality of memory cells each provided at the intersections of said plurality of bit line pairs and said plurality of word lines such that only one memory cell is connected to a corresponding bit line pair in said prescribed number of bit line pairs when one of said plurality of word lines is selected.

3. A semiconductor dynamic RAM according to claim 1, wherein said selective connecting means comprises transfer gate transistors provided between each of the bit lines constituting said plurality of bit line pairs and the corresponding sense amplifier means, said transfer gate transistors being turned on/off in response to the address information of the selected word line.

4. A semiconductor dynamic RAM according to claim 1, wherein said selective connecting means comprises
    means provided for each of said plurality of bit line pairs for precharging and equalizing bit line potentials of the bit line pair to a predetermined potential, and
    means for inactivating only that precharging equalizing means which is provided on the bit line pair to which the memory cell connected to the selected word line belongs, based on address information of the selected word line.

5. A method of operating a semiconductor dynamic RAM provided with a plurality of pairs of bit lines to which information of a selected memory cell is transferred, said semiconductor dynamic RAM having a plurality of sense amplifiers, one for every prescribed number of said plurality of bit line pairs, provided only on one side of said plurality of bit lines in a line, said method comprising the steps of:
    selecting one word line out of a plurality of word lines provided intersecting with each of said bit line pairs;
    completing precharging operation only of that bit line pair to which a memory cell connected to said selected word line belongs based on address information of said selected word line;
    connecting only said bit line pair on which the precharging operation is completed to a corresponding sense amplifier; and
    transferring information of the memory cell connected to said selected word line to the bit line connected to the memory cell and detecting and amplifying the memory cell information.

6. A semiconductor dynamic RAM as recited in claim 1 wherein said sense amplifier means comprise a plurality of sense amplifiers, one sense amplifier provided for each group of bit lines including said prescribed number of bit line pairs and connected between said prescribed number of bit line pairs and a data input/output bus, thereby relaxing a pitch requirement for said sense amplifiers.

7. A semiconductor dynamic RAM having the operation of detecting and amplifying information of a selected memory cell connected to a selected word line by means of a sense amplifier, comprising:
    a plurality of bit line pairs arranged extending in one direction in parallel with each other, with two adjacent bit lines constituting a pair, whereby a selected bit line pair is spaced apart by at least two bit lines from an adjacent selected bit line pair and capacitively coupled noise from adjacent selected bit line pairs is reduced;
    said plurality of bit line pairs arranged in groups of bit line pairs, each group including a predetermined number of said bit line pairs;
    a plurality of sense amplifier means, one for each of said groups of said bit line pairs;
    a plurality of word lines arranged in a direction intersecting said plurality of bit line pairs; and
    selective connecting means for selectively connecting only one pair of bit lines from each group of bit line pairs to a corresponding one of said plurality of sense amplifier means and for supplying remaining bit line pairs of said group with a predetermined precharge potential in response to address information of a selected word line among said plurality of word lines.

8. A semiconductor dynamic RAM as recited in claim 7 wherein said predetermined number of bit pairs forming a group includes two bit line pairs of said plurality of bit line pairs.

9. A semiconductor dynamic RAM as recited in claim 8 wherein said selective connecting means comprises transfer gate transistors provided between each of the bit lines constituting said group of bit line pairs and the corresponding sense amplifier means, said transfer gate transistors being turned on/off in response to the address information of the selected word line.

10. A semiconductor dynamic RAM as recited in claim 7 further comprising a data input/output bus, wherein said plurality of sense amplifier means are connected between respective groups of said plurality of bit line pairs and said data input/output bus.

11. A semiconductor dynamic RAM as recited in claim 7 wherein provision of said plurality of sense amplifier means thereby relaxes a pitch requirement for said sense amplifier means and permitting said plurality of sense amplifier means to be arranged in a single row provided on only one side of said plurality of bit line pairs.

12. A semiconductor dynamic RAM having the operation of detecting and amplifying information of a selected memory cell connected to a selected word line by means of a sense amplifier, comprising:
  a plurality of bit line pairs arranged extending in one direction in parallel with each other, with two adjacent bit lines constituting a pair, whereby a selected bit line pair is spaced apart by at least two bit lines from an adjacent selected bit line pair and capacitively coupled noise from adjacent selected bit line pairs is reduced;
  sense amplifier means, one for every prescribed number of bit line pairs out of said plurality of bit line pairs, provided only on one side of said plurality of bit line pairs, said sense amplifier means arranged in a line;
  a plurality of word lines arranged in a direction intersecting said plurality of bit line pairs; and
  selective connecting means for selectively connecting only one pair of bit lines out of said prescribed number of bit line pairs to a corresponding sense amplifier means in accordance with an address of a selected word line among said plurality of word lines and for holding remaining bit line pairs at a precharge potential,
  wherein said selective connecting means comprises means provided for each of said plurality of bit line pairs for precharging and equalizing bit line potentials of the bit line pair to a predetermined potential, and means for inactivating only that precharging-equalizing means which is provided on the bit line pair to which the memory cell connected to the selected word line belongs, based on address information of the selected word line.

* * * * *